(12) United States Patent
Zeng

(10) Patent No.: US 11,587,987 B2
(45) Date of Patent: Feb. 21, 2023

(54) DISPLAY PANEL COMPRISING ADJUSTMENT UNIT AND DISPLAY DEVICE

(71) Applicant: Xiamen Tianma Micro-Electronics Co., Ltd., Xiamen (CN)

(72) Inventor: Yang Zeng, Shanghai (CN)

(73) Assignee: XIAMEN TIANMA MICRO-ELECTRONICS CO., LTD., Xiamen (CN)

( * ) Notice: Subject to any disclaimer, the term of this patent is extended or adjusted under 35 U.S.C. 154(b) by 40 days.

(21) Appl. No.: 17/104,243

(22) Filed: Nov. 25, 2020

(65) Prior Publication Data

US 2022/0102440 A1     Mar. 31, 2022

(30) Foreign Application Priority Data

Sep. 30, 2020   (CN) .......................... 202011060048.3

(51) Int. Cl.
*H01L 27/32*     (2006.01)
*H01L 51/52*     (2006.01)

(52) U.S. Cl.
CPC ........ *H01L 27/3218* (2013.01); *H01L 27/323* (2013.01); *H01L 51/5284* (2013.01)

(58) Field of Classification Search
CPC ............... H01L 27/321; H01L 27/3213; H01L 27/3216; H01L 27/3218; H01L 27/322; H01L 51/5281
See application file for complete search history.

(56) References Cited

U.S. PATENT DOCUMENTS

2009/0135352 A1*   5/2009   Suzuki .............. G02F 1/133514
                                                                    349/114

FOREIGN PATENT DOCUMENTS

| CN | 110311048 | * 10/2019 | ............ H01L 51/50 |
| CN | 110911439 A | 3/2020 | |
| CN | 111312792 A | 6/2020 | |

* cited by examiner

*Primary Examiner* — Jesse Y Miyoshi
(74) *Attorney, Agent, or Firm* — Anova Law Group PLLC

(57) ABSTRACT

A display panel includes a substrate; an array layer, disposed on the substrate; a light-emitting structure layer, disposed on the side of the array layer away from the substrate and including a plurality of sub-pixels, including first and second sub-pixels of a same color. The display panel includes first adjustment units and second adjustment units, disposed on the light-emitting structure layer. The first adjustment units are in one-to-one correspondence with the first sub-pixels, and vertical projections of each first adjustment unit and the corresponding first sub-pixel at least partially overlap. The second adjustment units are in one-to-one correspondence with the second sub-pixels, and vertical projections of each second adjustment unit and the corresponding second sub-pixel at least partially overlap. Light beams with a same phase, after passing through a first adjustment unit and a second adjustment unit, have a non-zero phase difference.

19 Claims, 10 Drawing Sheets

FIG. 1

DISPLAY PANEL COMPRISING ADJUSTMENT UNIT AND DISPLAY DEVICE

CROSS-REFERENCE TO RELATED APPLICATION

This application claims the priority of Chinese patent application No. 202011060048.3, filed on Sep. 30, 2020, the entirety of which is incorporated herein by reference.

FIELD OF THE DISCLOSURE

The present disclosure generally relates to the field of display technology and, more particularly, relates to a display panel and a display device.

BACKGROUND

An organic light-emission diode (OLED) display is a self-emission display that uses organic light-emitting diodes for light emission in order to display images. The OLED display shows many desired features, such as high brightness, wide selection of materials, low driving voltage, fully-cured active light emission, etc. and also demonstrates various advantages, such as high definition, wide viewing angle, fast response speed, etc.

To reduce the reflectivity of external light in the OLED display, according to existing technology, a circular polarizer is usually attached to the light-emitting surface of the OLED display. However, the circular polarizer may also reduce the light-output efficiency of the OLED display.

Therefore, instead of attaching a circular polarizer to the light-emitting surface of the OLED display, setting color resistances in an OLED display may be able to improve the light-output efficiency of the OLED display. For example, setting a red color resistance in correspondence with each red sub-pixel, a green color resistance in correspondence with each green sub-pixel, and a blue color resistance in correspondence with each blue sub-pixel may improve the light-output efficiency of the OLED display.

However, when color resistances are set on the light-emitting surface of the OLED display, the reflection of the external light beams may increase in the OLED display, and the periodic sub-pixels of the same color may form a diffraction grating, such that after the external light beams are reflected by the periodic sub-pixels of the same color, the reflected light beams may undergo grating diffraction, thereby affecting the visual effect of the OLED display.

The disclosed display panel and display device are directed to solve one or more problems set forth above and other problems in the art.

BRIEF SUMMARY OF THE DISCLOSURE

One aspect of the present disclosure provides a display panel. The display panel includes a substrate; an array layer, disposed on a side of the substrate; a light-emitting structure layer, disposed on a side of the array layer away from the substrate and including a plurality of sub-pixels. The plurality of sub-pixels includes a plurality of first sub-pixels and a plurality of second sub-pixels that are in a same color. The display panel further includes a plurality of first adjustment units and a plurality of second adjustment units, both disposed on a side of the light-emitting structure layer away from the substrate. The plurality of first adjustment units corresponds to the plurality of first sub-pixels in a one-to-one manner, and vertical projections of each first adjustment unit and a corresponding first sub-pixel on the substrate at least partially overlap with each other. The plurality of second adjustment units corresponds to the plurality of second sub-pixels in a one-to-one manner, and vertical projections of each second adjustment unit and a corresponding second sub-pixel on the substrate at least partially overlap with each other. After passing through a first adjustment unit and a second adjustment unit, light beams with a same phase have a non-zero phase difference.

Another aspect of the present disclosure provides a display device. The display device includes the display panel according the present disclosure.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Various exemplary embodiments of the present disclosure will now be described in detail with reference to the accompanying drawings. It should be noted that unless specifically stated otherwise, the relative arrangement of the components and steps, numerical expressions and numerical values set forth in the embodiments do not limit the scope of the present disclosure. The following description of the at least one exemplary embodiment is merely illustrative, and by no means can be considered as limitations for the application or use of the present disclosure.

It should be noted that techniques, methods, and apparatuses known to those of ordinary skill in the relevant art may not be discussed in detail, but where appropriate, the techniques, methods, and apparatuses should be considered as part of the specification.

It should be noted that in all the examples provided and discussed herein, any specific value should be interpreted as merely exemplary and not as a limitation. Therefore, other examples of the exemplary embodiments may have different values.

It should be noted that similar reference numbers and letters indicate similar items in subsequent figures, and therefore, once an item is defined in a figure, it is not required to be further discussed or defined in the subsequent figures.

Figure 1:
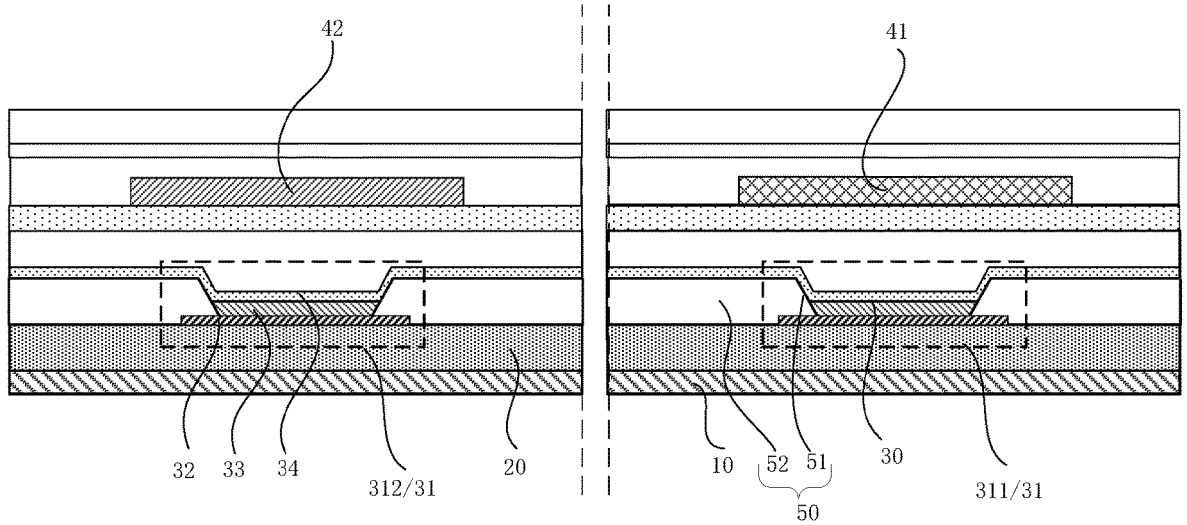
FIG. 1 illustrates a schematic structural diagram of an exemplary display panel according to various embodiments of the present disclosure.

FIG. 1 illustrates a schematic structural diagram of an exemplary display panel according to various embodiments of the present disclosure. Referring to FIG. 1, the display panel may include a substrate 10; an array layer 20, disposed on a side of the substrate 10; and a light-emitting structure layer 30, disposed on the side of the array layer 20 away from the substrate. The light-emitting structure layer 30 may include a plurality of sub-pixels 31. The plurality of sub-pixels 31 may include a plurality of first sub-pixels 311 and a plurality of second sub-pixels 312, and the plurality of first sub-pixels 311 and the plurality of second sub-pixels 312 may be in a same color.

The display panel may further include a plurality of first adjustment units 41 and a plurality of second adjustment units 42. The plurality of first adjustment units 41 and the plurality of second adjustment units 42 may be disposed on the side of the light-emitting structure layer 30 away from the substrate 10. The plurality of first adjustment units 41 may correspond to the plurality of first sub-pixels 311 in a one-to-one manner, and the vertical projections of each first adjustment unit 41 and the corresponding first sub-pixel 311 on the substrate 10 may at least partially overlap. The plurality of second adjustment units 42 may correspond to the plurality of second sub-pixels 312 in a one-to-one manner, and the vertical projections of each second adjustment unit 42 and the corresponding second sub-pixel 312 on the substrate 10 may at least partially overlap. After passing through a first adjustment unit 41 and a second adjustment unit 42, light beams with a same phase may have a phase difference greater than zero. It should be noted that the phase difference here refers to the absolute value of the difference in the phases of the light beams; thus, a phase difference greater than zero is equivalent to a non-zero difference in the phases of the light beams.

In one embodiment, referring to FIG. 1, in the display panel, the plurality of sub-pixels 31 may include a plurality of first sub-pixels 311 and a plurality of second sub-pixels 312, and the plurality of first sub-pixels 311 and the plurality of second sub-pixels 312 may be in a same color. For example, the first sub-pixels 311 and the second sub-pixels 312 may all be red sub-pixels. Alternatively, the first sub-pixels 311 and the second sub-pixels 312 may all be green sub-pixels, or the first sub-pixels 311 and the second sub-pixels 312 may all be blue sub-pixels. In one embodiment, the array layer 20 may include a plurality of sub-pixel control units (not shown), configured to control whether the sub-pixels 31 in the light-emitting structure layer 30 emit light. In one embodiment, a pixel definition layer 50 may be disposed on the substrate 10. The pixel definition layer 50 may include a plurality of openings 51 and a planarized layer 52 between adjacent openings 51. The pixel definition layer 50 may be configured to define the positions for arranging the plurality of sub-pixels 31 in the light-emitting structure layer 30. Each sub-pixel 31 may be located in a corresponding opening 51. Further, an insulating layer may be disposed between adjacent conductive film layers for forming the plurality of sub-pixel control units. In one embodiment, the display panel may further include a cover plate, an optical adhesive layer, a film encapsulation layer (not shown), etc. which are not described in details in the present disclosure.

In one embodiment, the plurality of sub-pixels 31 may further include an anode layer 32 corresponding to each sub-pixel 31, a light-emitting layer 33 corresponding to each sub-pixel 31, and a cathode layer 34 corresponding to all sub-pixels 31. That is, the cathode layer 34 may be disposed as a single continuous layer for the plurality of sub-pixels 31. The anode layers 32 of the plurality of sub-pixels 31 may be electrically isolated from each other, and the plurality of anode layers 32 may correspond to the plurality of openings 51 in a one-to-one manner. The vertical projections of each anode layer 31 and the corresponding opening 51 on the substrate 10 may at least partially overlap with each other. In one embodiment, the anode layer 32 may be made of a metal, and external light transmitted to the anode layer 32 may be reflected. To simplify the manufacturing process of the display panel and improve the display performance of the display panel, the sub-pixels 31 of the same color in the display panel may be periodically arranged. That is, the anode layers 32 of the plurality of sub-pixels 31 in the display panel may form a dot-matrix (e.g., lattice) serving as a reflection surface. The anode layers 32 of the sub-pixels 31 of the same color may thus form a two-dimensional grating surface, such that the grating diffraction phenomenon may take place when external light beams are reflected by the anode layers 32 of the sub-pixels 31 of the same color. When the display panel does not emit light or the luminous brightness is low, the display panel may show obvious color stripes, thereby affecting the display performance of the display panel.

In one embodiment, the display panel may further include a plurality of first adjustment units 41 and a plurality of second adjustment units 42. The plurality of first adjustment units 41 may be disposed on the side of the light-emitting structure layer 30 away from the substrate 10. The plurality of first adjustment units 41 may correspond to the plurality of first sub-pixels 311 in a one-to-one manner, and the vertical projections of each first adjustment unit 41 and the corresponding first sub-pixel 311 on the substrate 10 may at least partially overlap. The plurality of second adjustment units 42 may also be disposed on the side of the light-emitting structure layer 30 away from the substrate 10. The plurality of second adjustment units 42 may correspond to the plurality of second sub-pixels 312 in a one-to-one manner, and the vertical projections of each second adjustment unit 42 and the corresponding second sub-pixel 312 on the substrate 10 may at least partially overlap. After passing through a first adjustment unit 41 and a second adjustment unit 42, light beams with a same phase may have a phase difference greater than zero. The external light beams may reach the anode layers 32 of the plurality of sub-pixels 31 through the first adjustment units 41 or the second adjustment units 42, and may exit from the light-emitting surface of the display panel through the first adjustment units 41 or the second adjustment units 42 after being reflected by the anode layers 32 of the plurality of sub-pixels 31. Because after passing through a first adjustment unit 41 and a second adjustment unit 42, light beams with a same phase may have a phase difference greater than zero, the arrangement of the first adjustment units 41 and the second adjustment units 42 may effectively suppress the grating diffraction phenomenon of the light beams emitted from the light-emitting surface of the display panel after external light beams are reflected by the anode layers 32 of the sub-pixels 31 of the same color.

It should be noted that naming the first sub-pixels and the second sub-pixels in the present disclosure is merely for distinguishing the locations of the first adjustment units and the second adjustment units, and the first sub-pixels and the second sub-pixels are substantially the same sub-pixels. Moreover, the first sub-pixels and the second sub-pixels in the present disclosure are sub-pixels of the same color, which does not limit the display panel to only include sub-pixels of one color. The description provided herein is merely used to illustrate that the sub-pixels of the same color in the display panel can be provided with first adjustment units and second adjustment units correspondingly.

It should be noted that FIG. 1 exemplarily shows that a first sub-pixel and a second sub-pixel are provided in the display panel. The quantities of the first sub-pixels and the second sub-pixels are not limited in the present disclosure. In addition, the display panel according to the present disclosure is not limited to include sub-pixels of only one color.

In one embodiment, referring to FIG. 1, the vertical projection of each first sub-pixel 311 on the substrate 10 may be located in the vertical projection of the corresponding first adjustment unit 41 on the substrate 10, and the vertical projection of each second sub-pixel 312 on the substrate 10 may be located in the vertical projection of the corresponding second adjustment unit 42 on the substrate 10.

For example, the vertical projection of each first sub-pixel 311 on the substrate 10 may be located in the vertical projection of the corresponding first adjustment unit 41 on the substrate 10, and the area size of the vertical projection of the first sub-pixel 311 on the substrate 10 may be smaller than the area size of the vertical projection of the corresponding first adjustment unit 41 on the substrate 10. That is, along the direction perpendicular to the plane of the substrate 10, the first adjustment unit 41 may completely cover the corresponding first sub-pixel 311, such that most of the external light beams reflected by the first sub-pixel 311 may be transmitted out after passing through the first adjustment unit 41 corresponding to the first sub-pixel 311.

The vertical projection of each second sub-pixel 312 on the substrate 10 may be located in the vertical projection of the corresponding second adjustment unit 42 on the substrate 10, and the area size of the vertical projection of the second sub-pixel 312 on the substrate 10 may be smaller than the area size of the vertical projection of the corresponding second adjustment unit 42 on the substrate 10. That is, along the direction perpendicular to the plane of the substrate 10, the second adjustment unit 42 may completely cover the corresponding second sub-pixel 312, such that most of the external light beams reflected by the second sub-pixel 312 may be transmitted out after passing through the second adjustment unit 2 corresponding to the second sub-pixel 312. As such, the display panel may further suppress the grating diffraction phenomenon of the light beams emitted from the light-emitting surface of the display panel after external light beams are reflected by the anode layers 32 of the sub-pixels 31 of the same color.

Figure 2:
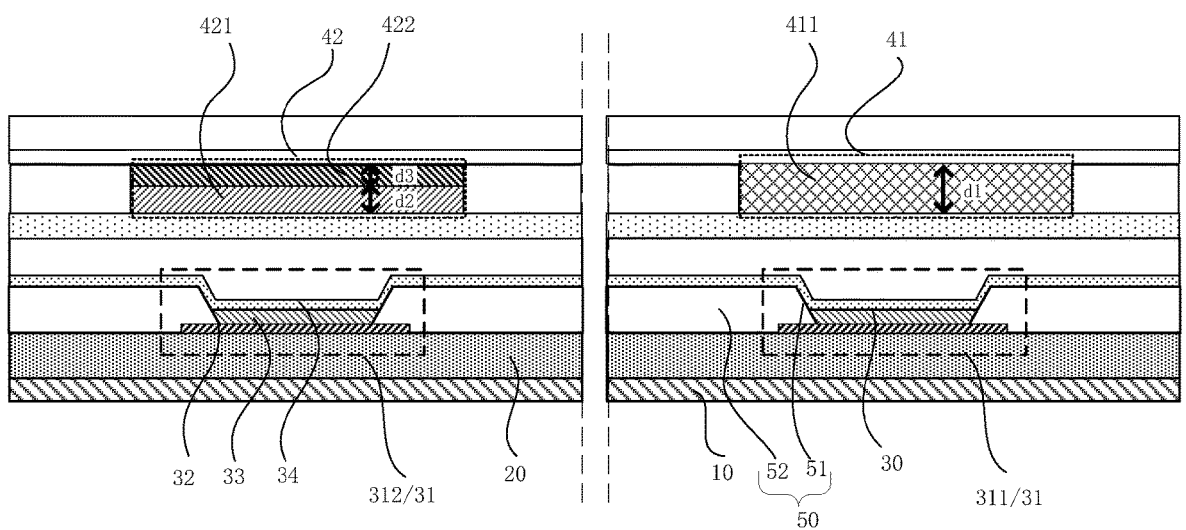
FIG. 2 illustrates a schematic structural diagram of another exemplary display panel according to various embodiments of the present disclosure.

FIG. 2 illustrates a schematic structural diagram of another exemplary display panel according to various embodiments of the present disclosure. The display panel shown in FIG. 2 may be substantially the same as the display panel shown in FIG. 1, and in the following, description will be focused on the differences between the display panels shown in FIGS. 1-2. Referring to FIG. 2, the first adjustment unit 41 of the display panel may include a first optical layer 411, and along the direction perpendicular to the substrate 10, the thickness of the first optical layer 411 may be d1, and the refractive index of the first optical layer 411 may be n1. The second adjustment unit 42 of the display panel may include a second optical layer 421, and along the direction perpendicular to the substrate 10, the thickness of the second optical layer 421 may be d2, and the refractive index of the second optical layer 421 may be n2. In one embodiment, d1>d2.

For example, referring to FIG. 2, the first adjustment unit 41 may include a first optical layer 411, and the second adjustment unit 42 may include a second optical layer 421. The thickness of the first optical layer 411 may be different from the thickness of the second optical layer 421. That is, by arranging a first optical layer 411 in the first adjustment unit 41 and a second optical layer 421 in the second adjustment unit 42, and adjusting the thicknesses of the first optical layer 411 and the second optical layer 421, light beams with a same phase may have a phase difference greater than zero after passing through a first adjustment unit 41 and a second adjustment unit 42.

In one embodiment, $n1 \times d1 - n2 \times d2 \neq 0$. For example, referring to FIG. 2, along the direction perpendicular to the substrate 10, the thickness of the first optical layer 411 may be d1, and the thickness of the second optical layer 421 may be d2. In addition, the refractive index of the first optical layer 411 may be n1, and the refractive index of the second optical layer 421 may be n2. The optical path difference of the light beams of the same phase after passing through the first adjustment unit 41 and the second adjustment unit 42 may be $2 \times (n1 \times d1 - n2 \times d2)$. Therefore, $n1 \times d1 - n2 \times d2 \neq 0$ indicates that an optical path difference between light beams of the same phase after passing through the first adjustment unit 41 and the second adjustment unit 42 is greater than zero. It should be noted that the optical path difference here refers to the absolute value of the difference in the optical paths of the light beams; thus, an optical path difference greater than zero is equivalent to a non-zero difference in the optical paths of the light beams.

In one embodiment, the external light beams may reach the anode layers 32 of the sub-pixels 31 respectively through the first adjustment units 41 and the second adjustment units 42, and then the external light beams may exit the light-emitting surface of the display panel respectively through the first adjustment units 41 and the second adjustment units 42 after being reflected by the anode layers 32 of the sub-pixels 31. At this time, the phase difference between the external light beams reflected by sub-pixels 31 corresponding to the first adjustment units 41 and the external light beams reflected by sub-pixels 31 corresponding to the second adjustment units 42 may be 4π/λ×(n1×d1−n2×d2), where λ is the wave-length of the light beams after the external light beams are reflected by the sub-pixels 31. Because the external light beams reflected by the sub-pixels 31 of the same color may have the same wave-length, the phase difference between the external light beams reflected by the sub-pixels 31 corresponding to the first adjustment units 41 and the external light beams reflected by the sub-pixels 31 corresponding to the second adjustment units 42 may be greater than zero.

In one embodiment, n1 may be equal to n2 (n1=n2), that is, the refractive index of the first optical layer 411 and the refractive index of the second optical layer 421 may be the same. Accordingly, the first optical layer 411 and the second optical layer 421 may be made of a same material and fabricated through a same process. As such, the manufacturing process may be effectively simplified and the production cost may be reduced. At this time, the optical path difference between the external light beams reflected by the sub-pixels 31 corresponding to the first adjustment units 41 and the external light beams reflected by the sub-pixels 31 corresponding to the second adjustment units 42 may be 2n1×(d1−d2), and the phase difference may be 4n1π/λ×(d1−d2). As such, by simply adjusting the thickness of the first optical layer 411 and the second optical layer 421, a phase difference between the external light beams reflected by the sub-pixels 31 corresponding to the first adjustment units 41 and the external light beams reflected by the sub-pixels 31 corresponding to the second adjustment units 42 greater than zero may be realized.

In one embodiment, referring to FIG. 2, each second adjustment unit 42 may further include a third optical layer 422. Along the direction perpendicular to the substrate 10, the third optical layer 422 may be stacked with the second optical layer 421. The thickness of the third optical layer 422 may be d3, and the refractive index of the third optical layer 422 may be n3.

For example, in each second adjustment unit 42, a third optical layer 422 may be stacked with the second optical layer 421 along the direction perpendicular to the substrate 10. By disposing the first optical layer 411 in the first adjustment unit 41, and disposing the second optical layer 421 and the third optical layer 422 in the second adjustment unit 42, after the light beams with a same phase pass through the first adjustment units 41 and the second adjustment units s42, the phase difference may be greater than zero.

In one embodiment, d1=d2+d3, and n1×d1−n2×d2−n3×d3≠0. For example, referring to FIG. 2, along the direction perpendicular to the substrate 10, the thickness of the first optical layer 411 may be d1, the thickness of the second optical layer 421 may be d2, and the thickness of the third optical layer 422 may be d3. In addition, the refractive index of the first optical layer 411 may be n1, the refractive index of the second optical layer 421 may be n2, and the refractive index of the third optical layer 422 may be n3. The optical path difference of the light beams of the same phase after passing through the first adjustment unit 41 and the second adjustment unit 42 may be 2×(n1×d1−n2×d2−n3×d3). Therefore, n1×d1−n2×d2−n3×d3≠0 indicates that an optical path difference between light beams of the same phase after passing through the first adjustment unit 41 and the second adjustment unit 42 is greater than zero.

In one embodiment, the external light beams may reach the anode layers 32 of the sub-pixels 31 respectively through the first adjustment units 41 and the second adjustment units 42, and then the external light beams may exit the light-emitting surface of the display panel respectively through the first adjustment units 41 and the second adjustment units 42 after being reflected by the anode layers 32 of the sub-pixels 31. At this time, the phase difference between the external light beams reflected by sub-pixels 31 corresponding to the first adjustment units 41 and the external light beams reflected by sub-pixels 31 corresponding to the second adjustment units 42 may be 4π/λ×(n1×d1−n2×d2−n3×d3), where λ is the wave-length of the light beams after the external light beams are reflected by the sub-pixels 31. Because the external light beams reflected by the sub-pixels 31 of the same color may have the same wave-length, the phase difference between the external light beams reflected by the sub-pixels 31 corresponding to the first adjustment units 41 and the external light beams reflected by the sub-pixels 31 corresponding to the second adjustment units 42 may be greater than zero.

In one embodiment, the first adjustment unit 41 may include a first optical layer 411, and the second adjustment unit 42 may include a second optical layer 421 and a third optical layer 422 that are stacked together along the direction perpendicular to the substrate 10. Along the direction perpendicular to the substrate 10, the thickness of the first optical layer 411 may be d1, the thickness of the second optical layer 421 may be d2, the thickness of the third optical layer 422 may be d3, and d1=d2+d3. As such, along the direction perpendicular to the substrate 10, the thickness of the first adjustment unit 41 and the thickness of the second adjustment unit 42 may be the same, thereby avoiding the film layer difference between the first adjustment unit 41 and the second adjustment unit 42 in the display panel, and effectively improving the flatness of the display panel.

In one embodiment, n1=n2≠n3. That is, the refractive index of the first optical layer 411 and the refractive index of the second optical layer 421 may be the same. Accordingly, the first optical layer 411 and the second optical layer 421 may be made of a same material and fabricated through a same process. As such, the manufacturing process may be effectively simplified and the production cost may be reduced. Further, by dispose the third optical layer 422, the thickness of the first adjustment unit 41 may thus be equal to the thickness of the second adjustment unit 42 along the direction perpendicular to the substrate 10, thereby effectively improving the flatness of the display panel.

Figure 3:
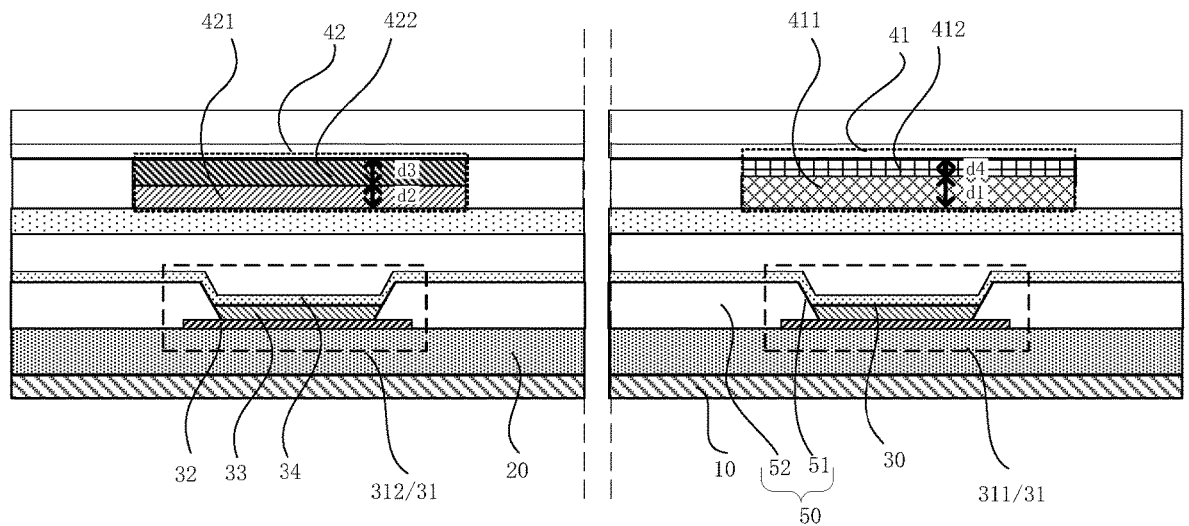
FIG. 3 illustrates a schematic structural diagram of another exemplary display panel according to various embodiments of the present disclosure.

FIG. 3 illustrates a schematic structural diagram of another exemplary display panel according to various embodiments of the present disclosure. Referring to FIG. 3, in one embodiment, each first adjustment unit 41 may further include a fourth optical layer 412. Along the direction perpendicular to the substrate 10, the thickness of the fourth optical layer 412 may be d4. In addition, the refractive index of the fourth optical layer 412 may be n4. In one embodiment, d1+d4=d2+d3, d4<d3, and d1×n1+d4×n4−d2×n2−d3×n3≠0.

For example, referring to FIG. 3, the first adjustment unit 41 may further include a fourth optical layer 412. Along the direction perpendicular to the substrate 10, the thickness of the first optical layer 411 may be d1, the thickness of the second optical layer 421 may be d2, the thickness of the third optical layer 422 may be d3, and the thickness of the fourth optical layer 412 may be d4. In addition, the refractive index of the first optical layer 411 may be n1, the refractive index of the second optical layer 421 may be n2, the refractive index of the third optical layer 422 may be n3, and the refractive index of the fourth optical layer 412 may be n4.

The optical path difference of the light beams of the same phase after passing through the first adjustment unit 41 and the second adjustment unit 42 may be $2\times(n1\times d1+n41\times d4-n2\times d2-n3\times d3)$. Therefore, $n1\times d1+n4\times d4-n2\times d2-n3\times d3\neq 0$ indicates that an optical path difference between light beams of the same phase after passing through the first adjustment unit 41 and the second adjustment unit 42 is greater than zero.

In one embodiment, the external light beams may reach the anode layers 32 of the sub-pixels 31 respectively through the first adjustment units 41 and the second adjustment units 42, and then the external light beams may exit the light-emitting surface of the display panel respectively through the first adjustment units 41 and the second adjustment units 42 after being reflected by the anode layers 32 of the sub-pixels 31. At this time, the phase difference between the external light beams reflected by sub-pixels 31 corresponding to the first adjustment units 41 and the external light beams reflected by sub-pixels 31 corresponding to the second adjustment units 42 may be $4\pi/\lambda\times(n1\times d1+n4\times d4-n2\times d2-n3\times d3)$, where $\lambda$ is the wave-length of the light beams after the external light beams are reflected by the sub-pixels 31. Because the external light beams reflected by the sub-pixels 31 of the same color may have the same wave-length, the phase difference between the external light beams reflected by the sub-pixels 31 corresponding to the first adjustment units 41 and the external light beams reflected by the sub-pixels 31 corresponding to the second adjustment units 42 may be greater than zero.

In one embodiment, the first adjustment unit 41 may include a first optical layer 411 and a fourth optical layer 412 that are stacked together along the direction perpendicular to the substrate 10, and the second adjustment unit 42 may include a second optical layer 421 and a third optical layer 422 that are stacked together along the direction perpendicular to the substrate 10. Along the direction perpendicular to the substrate 10, the thickness of the first optical layer 411 may be d1, the thickness of the second optical layer 421 may be d2, the thickness of the third optical layer 422 may be d3, the thickness of the fourth optical layer 412 may be d4, and d1+d4=d2+d3. As such, along the direction perpendicular to the substrate 10, the thickness of the first adjustment unit 41 and the thickness of the second adjustment unit 42 may be the same, thereby avoiding the film layer difference between the first adjustment unit 41 and the second adjustment unit 42 in the display panel, and effectively improving the flatness of the display panel.

Figure 4:
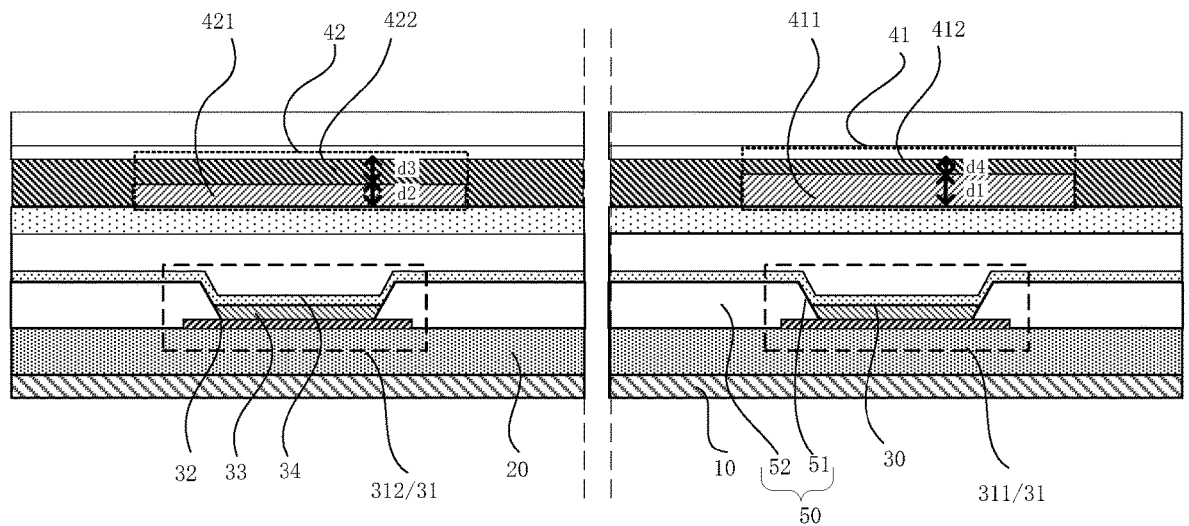
FIG. 4 illustrates a schematic structural diagram of another exemplary display panel according to various embodiments of the present disclosure.

FIG. 4 illustrates a schematic structural diagram of another exemplary display panel according to various embodiments of the present disclosure. Referring to FIG. 4, in one embodiment, the first optical layer 411 and the second optical layer 421 may be located in a film layer and made of a same material, so that n1=n2; the third optical layer 422 and the fourth optical layer 412 may be located in the same film layer and made of a same material, so that n3=n4. The phase difference between light beams reflected by the first sub-pixels 311 and the second sub-pixels 312 may be $4\pi/\lambda\times(d3-d4)\times(n1-n3)$, where $\lambda$ is the wave-length of the light beams after being reflected by the first sub-pixels 311 and the second sub-pixels 312.

For example, referring to FIG. 4, the first optical layer 411 and the second optical layer 421 may be located in a same film layer and made of a same material, and the third optical layer 422 and the fourth optical layer 412 may be located in a same film layer and made of a same material. That is, the first optical layer 411 in the first adjustment unit 41 and the second optical layer 421 in the second adjustment unit 42 may be formed in a same fabrication process, and the fourth optical layer 412 in the first adjustment unit 41 and the third optical layer 422 in the second adjustment unit 42 may be formed in a same fabrication process. As such, the manufacturing process may be effectively simplified and the production cost may be reduced.

The optical path difference of the light beams of the same phase after passing through the first adjustment unit 41 and the second adjustment unit 42 may be $2\times(d1\times n1+d4\times n4-d2\times n2-d3\times n3)$, and $n1\times d1+n4\times d4-n2\times d2-n3\times d3\neq 0$. Because n1=n2, n3=n4, and d1+d4=d2+d3, optical path difference of the light beams of the same phase after passing through the first adjustment unit 41 and the second adjustment unit 42 may then be $2\times(d3-d4)\times(n1-n3)$.

In one embodiment, the external light beams may reach the anode layers 32 of the sub-pixels 31 respectively through the first adjustment units 41 and the second adjustment units 42, and then the external light beams may exit the light-emitting surface of the display panel respectively through the first adjustment units 41 and the second adjustment units 42 after being reflected by the anode layers 32 of the sub-pixels 31. At this time, the phase difference between the external light beams reflected by sub-pixels 31 corresponding to the first adjustment units 41 and the external light beams reflected by sub-pixels 31 corresponding to the second adjustment units 42 may be $4\pi/\lambda\times(d3-d4)\times(n1-n3)$. In one embodiment, the first optical layer 411 and the second optical layer 421 may be located in a same film layer and made of a same material, and the third optical layer 422 and the fourth optical layer 412 may be located in a same film layer and made of a same material. As such, the design efficiency of the optical path difference of the light beams of the same phase after passing through the first adjustment units 41 and the second adjustment units 42 may be effectively improved, and the design difficulty of the first adjustment units 41 and the second adjustment units 42 may be reduced, thereby further reducing the production cost. In addition, when the thickness of the first optical layer 411 is not the same as the thickness of the second optical layer 421, adjusting the refractive indices of the first optical layer 411 and the third optical layer 422 may be able to further ensure that the phase difference between the external light beams reflected by the sub-pixels 31 corresponding to the first adjustment units 41 and the external light beams reflected by the sub-pixels 31 corresponding to the second adjustment units 42 is greater than zero.

Figure 5:
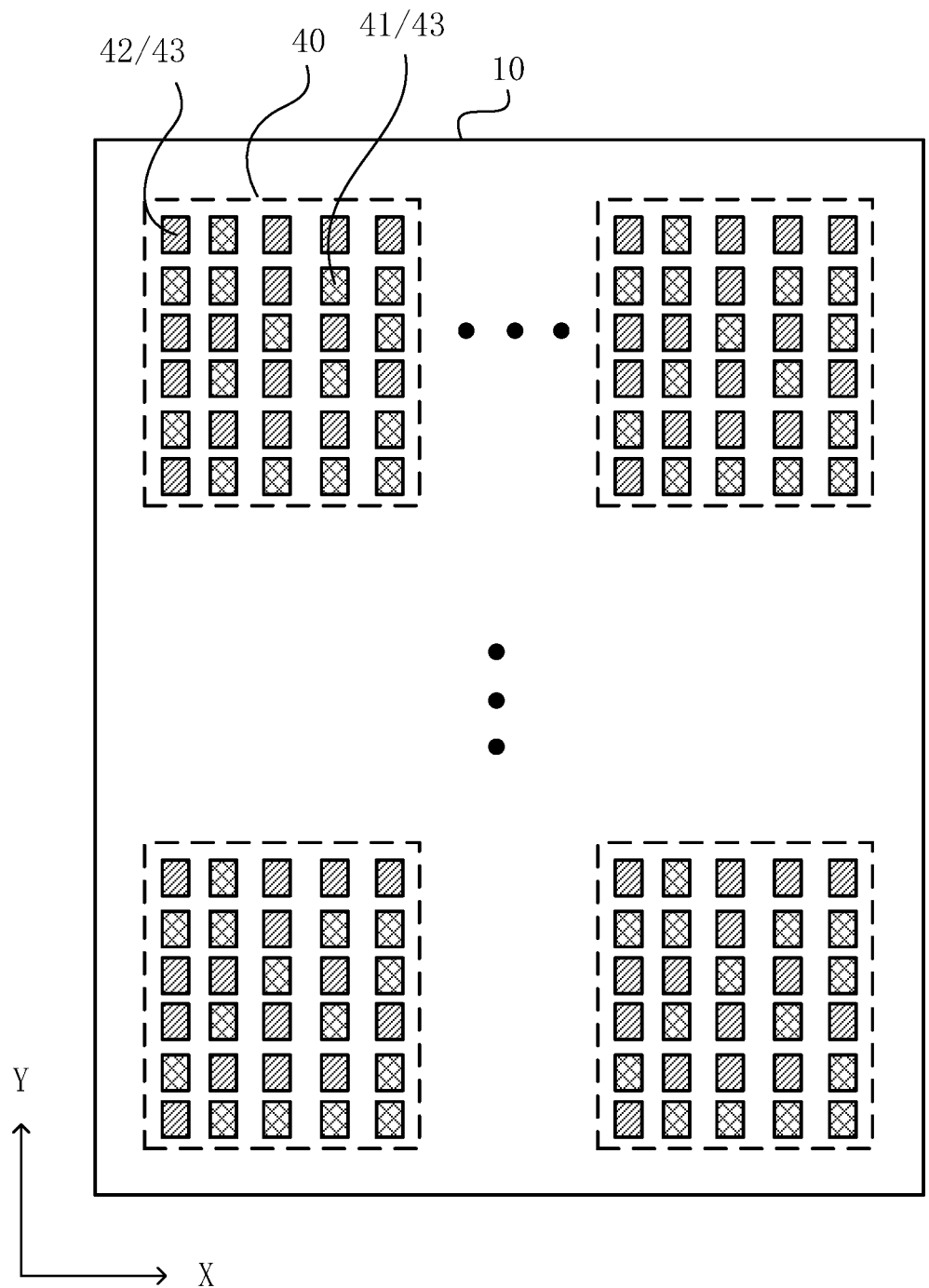
FIG. 5 illustrates a schematic structural diagram of another exemplary display panel according to various embodiments of the present disclosure.

FIG. 5 illustrates a schematic structural diagram of another exemplary display panel according to various embodiments of the present disclosure. Referring to FIG. 5, the display panel may include a plurality of adjustment-unit groups 40. The plurality of adjustment-unit groups 40 may include M rows of sub-units 43 arranged in the first direction X and N columns of sub-units 43 arranged in the second direction Y, where the first direction X and the second direction Y may be intersected with each other, M>2, and N>2. The sub-units 43 may include the first adjustment units 41 and the second adjustment units 42. The first adjustment units 41 and the second adjustment units 42 may be randomly arranged in each adjustment-unit group 40.

Further, referring to FIG. 1 and FIG. 5, the display panel may include a plurality of adjustment-unit groups 40. The plurality of adjustment-unit groups 40 may include M rows of sub-units 43 arranged in the first direction X and N columns of sub-units 43 arranged in the second direction Y. In one embodiment, the first direction X and the second direction Y may be intersected with each other.

Each sub-unit 43 of the M×N sub-units 43 in each adjustment-unit group 40 may be a first adjustment unit 41 or a second adjustment unit 42, and the first adjustment units 41 and the second adjustment units 42 may be randomly arranged in the adjustment-unit group 40. After light beams with a same incident phase pass through the first adjustment units 41 and the second adjustment units 42, respectively, the phase difference may be greater than zero. Therefore, after external light beams are reflected by the sub-pixels 31 corresponding to the first adjustment units 41 and the second adjustment units 42, the phase difference between the reflected light beams may be greater than zero. In addition, the first adjustment units 41 and the second adjustment units 42 are randomly arranged, in terms of the locations and/or the quantities, in the adjustment-unit group 40. Therefore, after external light beams are reflected by the anode layers 32 of the sub-pixels 31, the phase of the light beams emitted from the light-emitting surface of the display panel may be different. Therefore, randomly arranging the first adjustment units 41 and the second adjustment units 42 may break the periodic arrangement of the reflected light beams of the same color in the display panel, which may further suppress the grating diffraction phenomenon of the light beams emitted from the light-emitting surface of the display panel after external light beams are reflected by the anode layers 32 of the sub-pixels 31 of the same color.

For example, the positions of the first adjustment units 41 and the second adjustment units 42 may be randomly arranged in the adjustment-unit group 40, and a plurality of adjustment-unit groups 40 may be disposed in the display panel, such that the production process may be simplified, and the production efficiency may be improved.

It should be noted that in FIG. 5, the adjustment-unit group 40 including M rows of sub-units 43 along the first direction X and N columns of sub-units 43 along the second direction Y is exemplarily shown as the adjustment-unit group 40 including 6 rows of sub-units 43 along the first direction X, and 5 columns of sub-units 43 along the second direction Y. In other embodiments of the present disclosure, M and N may have other numerical values, and the present disclosure does not limit M and N to any specific values.

It should be noted that the positions and/or the quantities of the first adjustment units 41 and the second adjustment units 42 in each adjustment-unit group 40 may be arranged randomly. FIG. 5 merely illustrates an example of arranging the first adjustment units 41 and the second adjustment units 42 in the adjustment-unit group 40. In other embodiments, the first adjustment units 41 and the second adjustment units 42 in the adjustment-unit group 40 may be arranged in other ways, and the present disclosure does not limit the arrangement of the first adjustment units 41 and the second adjustment units 42 in the adjustment-unit group 40 to any specific manner.

Figure 6:
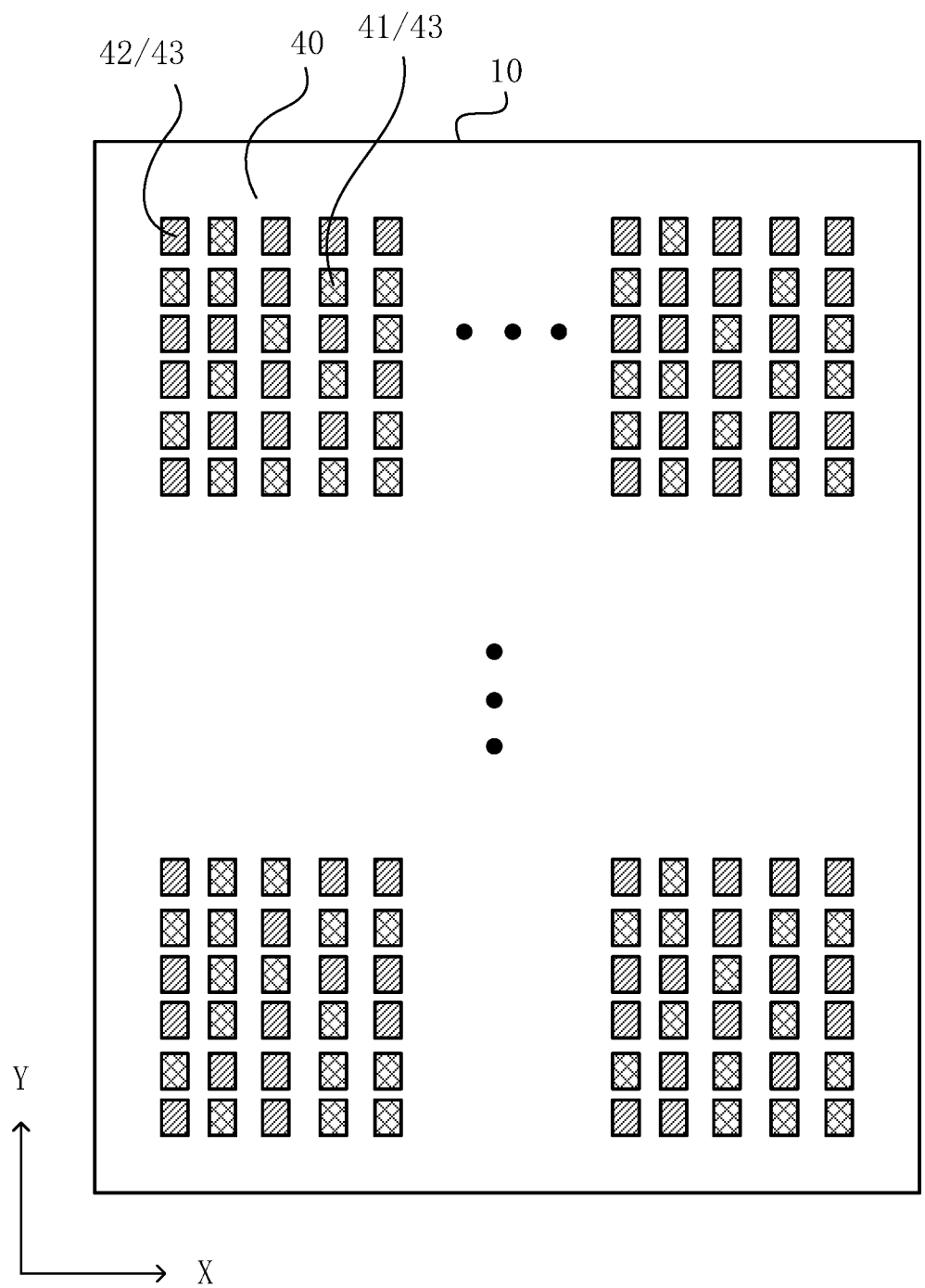
FIG. 6 illustrates a schematic structural diagram of another exemplary display panel according to various embodiments of the present disclosure.

FIG. 6 illustrates a schematic structural diagram of another exemplary display panel according to various embodiments of the present disclosure. Referring to FIG. 6, the first adjustment units 41 and the second adjustment units 42 may be arranged randomly in the display panel.

For example, referring to FIG. 1 and FIG. 6, the first adjustment units 41 and the second adjustment units 42 may be arranged randomly in the display panel. That is, the position arrangement and/or quantity arrangement of the first adjustment units 41 and the second adjustment units 42 in the display panel may be random and irregular.

After light beams with a same incident phase pass through the first adjustment units 41 and the second adjustment units 42, respectively, the phase difference may be greater than zero. Therefore, after external light beams are reflected by the sub-pixels 31 of the same color, the phase difference between the reflected light beams after passing through the first adjustment units 41 and the reflected light beams after passing through the second adjustment units 42 may be greater than zero. In addition, the positions and/or the quantities of the first adjustment units 41 and the second adjustment units 42 are arranged randomly in the display panel, after external light beams reflected by the anode layers 32 of the plurality of sub-pixels 31, the light beams emitted from the light-emitting surface of the display panel may have different phases. Randomly arranging the positions and/or quantities of the first adjustment units 41 and the second adjustment units 42 in the display panel may break the periodic arrangement of the reflected light beams of the same color in the display panel, which may further suppress the grating diffraction phenomenon of the light beams emitted from the light-emitting surface of the display panel after external light beams are reflected by the anode layers 32 of the sub-pixels 31 of the same color.

Figure 7:
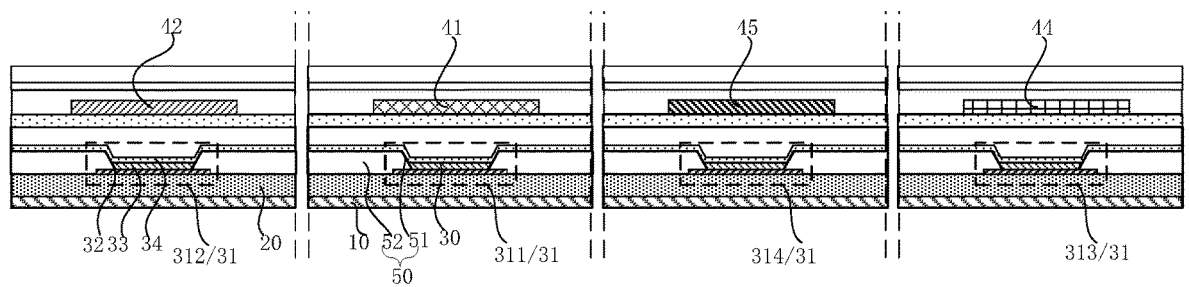
FIG. 7 illustrates a schematic structural diagram of another exemplary display panel according to various embodiments of the present disclosure.

FIG. 7 illustrates a schematic structural diagram of another exemplary display panel according to various embodiments of the present disclosure. Referring to FIG. 7, in one embodiment, the display panel may further include a plurality of third adjustment units 44 and a plurality of fourth adjustment units 45; the plurality of sub-pixels 31 may further include a plurality of third sub-pixels 313 and a plurality of fourth sub-pixels 314. The first sub-pixels 311, the second sub-pixels 312, the third sub-pixels 313, and the fourth sub-pixels 314 may be in a same color. The plurality of third adjustment units 44 may correspond to the plurality of third sub-pixels 313 in a one-to-one manner, and the vertical projections of each third adjustment unit 44 and the corresponding third sub-pixel 313 on the substrate 10 may at least partially overlap. The plurality of fourth adjustment units 45 may correspond to the plurality of fourth sub-pixels 314 in a one-to-one manner, and the vertical projections of each fourth adjustment unit 45 and the corresponding fourth sub-pixel 314 on the substrate 10 may at least partially overlap.

In one embodiment, light beams with a same phase, after passing through any two adjustment units of a first adjustment unit 41, a second adjustment unit 42, a third adjustment unit 44, and a fourth adjustment unit 45, may have a phase difference greater than zero. In addition, after the light beams with the same phase passing through different pairs of adjustment units of a first adjustment unit 41, a second adjustment unit 42, a third adjustment unit 44, and a fourth adjustment unit 45, the phase differences may be different.

For example, referring to FIG. 7, the plurality of sub-pixels 31 may include first sub-pixels 311, second sub-pixels 312, third sub-pixels 313, and fourth sub-pixels 314. The display panel may include a plurality of first adjustment units 41, a plurality of second adjustment units 42, a plurality of third adjustment units 44, and a plurality of fourth adjustment units 45. The plurality of first adjustment units 41 may correspond to the plurality of first sub-pixels 311 in a one-to-one manner, and the vertical projections of each first adjustment unit 41 and the corresponding first sub-pixel 311 on the substrate 10 may at least partially overlap. The plurality of second adjustment units 42 may correspond to the plurality of second sub-pixels 312 in a one-to-one manner, and the vertical projections of each second adjustment unit 42 and the corresponding second sub-pixel 311 on the substrate 10 may at least partially overlap. The plurality of third adjustment units 44 may correspond to the plurality of third sub-pixels 313 in a one-to-one manner, and the vertical projections of each third adjustment unit 44 and the corresponding third sub-pixel 313 on the substrate 10 may at least partially overlap. The plurality of fourth adjustment units 45 may correspond to the plurality of fourth sub-pixels 314 in a one-to-one manner, and the vertical projections of each fourth adjustment unit 45 and the corresponding fourth sub-pixel 314 on the substrate 10 may at least partially overlap.

Light beams with a same phase, after passing through any two adjustment units of a first adjustment unit 41, a second adjustment unit 42, a third adjustment unit 44, and a fourth adjustment unit 45, may have a phase difference greater than zero. In addition, after the light beams with the same phase passing through different pairs of adjustment units of a first adjustment unit 41, a second adjustment unit 42, a third adjustment unit 44, and a fourth adjustment unit 45, the phase differences may be different. Therefore, the phases of the external light beams being reflected by the sub-pixels 31 corresponding to the first adjustment unit 41, the second adjustment unit 42, the third adjustment unit 44, and the fourth adjustment unit 45, respectively may be different from each other, and the phase differences between external light beams being reflected by the sub-pixels 31 corresponding to different pairs of adjustment units in the first adjustment unit 41, the second adjustment unit 42, the third adjustment unit 44, and the fourth adjustment unit 45 may be different. As such, the grating diffraction phenomenon of the light beams emitted from the light-emitting surface of the display panel after external light beams are reflected by the anode layers 32 of the sub-pixels 31 of the same color may be further suppressed.

It should be noted that naming the first sub-pixels, the second sub-pixels, the third sub-pixels, and the fourth sub-pixels in the present disclosure is merely for distinguishing the locations of the first adjustment units, the second adjustment units, the third sub-pixels, and the fourth sub-pixels, and the first adjustment units, the second adjustment units, the third sub-pixels, and the fourth sub-pixels are substantially the same sub-pixels. Moreover, the first adjustment units, the second adjustment units, the third sub-pixels, and the fourth sub-pixels in the present disclosure are sub-pixels of the same color, which does not limit the display panel to only include sub-pixels of one color. The description provided herein is merely used to illustrate that the sub-pixels of the same color in the display panel can be provided with first adjustment units, second adjustment units, third adjustment units, and fourth adjustment units correspondingly.

It should be noted that the embodiment of the present disclosure exemplarily illustrates the sub-pixels with the same color in the display panel are correspondingly provided with first adjustment units, second adjustment units, third adjustment units, and fourth adjustment units. In other embodiments, the display panel may also include other adjustment units, for which, the present disclosure does not provide detailed illustration.

Figure 8:
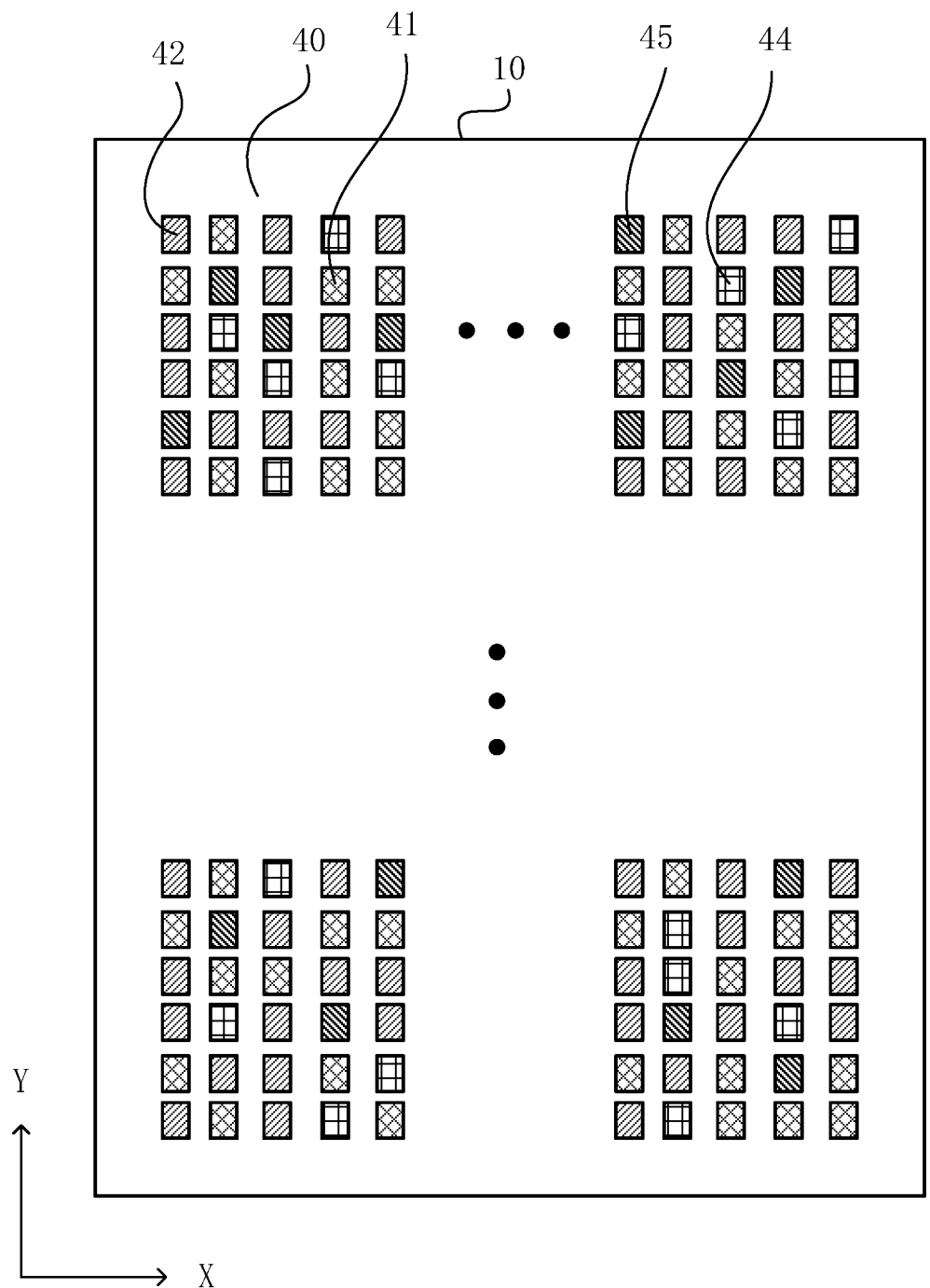
FIG. 8 illustrates a schematic structural diagram of another exemplary display panel according to various embodiments of the present disclosure.

FIG. 8 illustrates a schematic structural diagram of another exemplary display panel according to various embodiments of the present disclosure. Referring to FIG. 8, in one embodiment, the first adjustment units 41, the second adjustment units 42, the third adjustment units 44, and the fourth adjustment units 45 may be randomly arranged in the display panel.

For example, referring to FIG. 1 and FIG>8, the first adjustment units 41, the second adjustment units 42, the third adjustment units 44, and the fourth adjustment units 45 may be randomly arranged in the display panel. That is, the position arrangement and/or quantity arrangement of the first adjustment units 41, the second adjustment units 42, the third adjustment units 44, and the fourth adjustment units 45 in the display panel may be random and irregular.

After light beams with a same incident phase pass through any two of the first adjustment units 41, the second adjustment units 42, the third adjustment units 44, and the fourth adjustment units 45, respectively, the phase difference may be greater than zero. Therefore, after external light beams are reflected by the sub-pixels 31 of the same color, the phase difference between the reflected light beams after passing through any two of a first adjustment unit 41, a second adjustment unit 42, a third adjustment unit 44, and a fourth adjustment unit 45, respectively may be greater than zero. In addition, the positions and/or the quantities of the first adjustment units 41, the second adjustment units 42, the third adjustment units 44, and the fourth adjustment units 45 are arranged randomly in the display panel, after external light beams reflected by the anode layers 32 of the plurality of sub-pixels 31, the light beams emitted from the light-emitting surface of the display panel may have different phases. Randomly arranging the positions and/or quantities of the first adjustment units 41, the second adjustment units 42, the third adjustment units 44, and the fourth adjustment units 45 in the display panel may break the periodic arrangement of the reflected light beams of the same color in the display panel, which may further suppress the grating diffraction phenomenon of the light beams emitted from the light-emitting surface of the display panel after external light beams are reflected by the anode layers 32 of the sub-pixels 31 of the same color.

Figure 9:
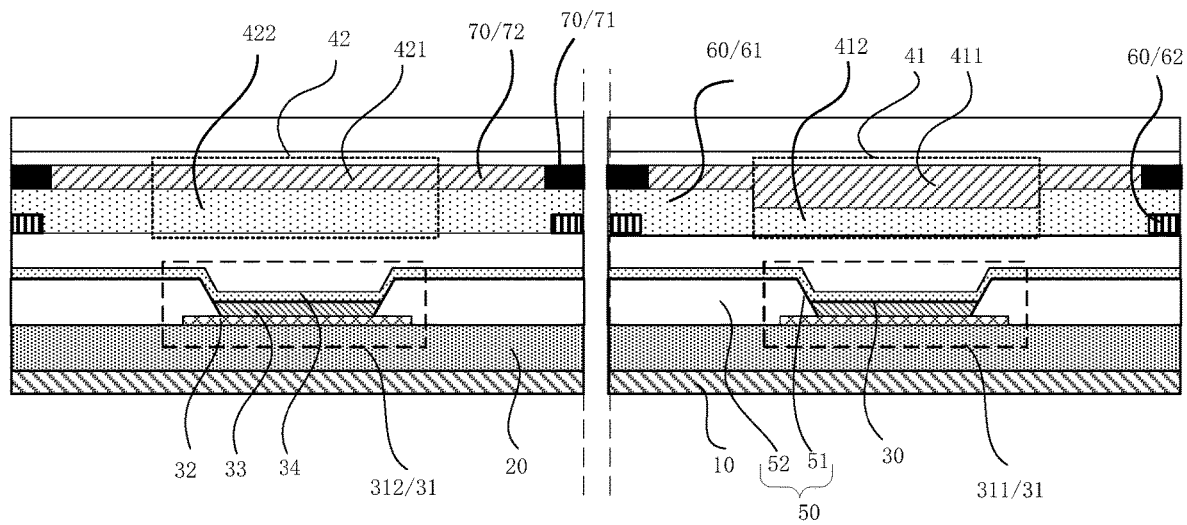
FIG. 9 illustrates a schematic structural diagram of another exemplary display panel according to various embodiments of the present disclosure.

FIG. 9 illustrates a schematic structural diagram of another exemplary display panel according to various embodiments of the present disclosure. Referring to FIG. 9, the display panel may further include a touch-control layer 60 and a color resist layer 70. The touch-control layer 60 may include a touch-control dielectric layer 61 and a touch-control function layer 62. The touch-control dielectric layer 61 may be located on the side of the light-emitting structure layer 30 away from the substrate, and the color resist layer 70 may be located on the side of the touch-control dielectric layer 61 away from the substrate 10. The color resist layer 70 may include a plurality of color resist units 71 and a black matrix 72. The plurality of color resist units 71 may be disposed in correspondence with the plurality of sub-pixels 31 of the same color. The vertical projection of the black matrix 72 on the touch-control layer 60 may cover the touch-control function layer 62. In one embodiment, the touch-control dielectric layer 62 may be multiplexed as the third optical layer 422 and the fourth optical layer 412.

In existing display panels, a circular polarizer may be disposed to reduce the reflection of ambient light, but the circular polarizer may also reduce the light-output efficiency of the OLED and affect the display performance of the display panel. In addition, the circular polarizer according to the existing manufacturing technology has a multi-layer structure with a large thickness, which is not conducive to reducing the thickness of the display panel. Further, the circular polarizer is brittle, which also affects the flexibility of the display panel.

Referring to FIG. 9, in one embodiment, the disclosed display panel may also include a color resist layer 70. The color resist layer 70 may be disposed on the side of the touch-control dielectric layer 61 away from the light-emitting structure layer 30. The color resist layer 70 may include a plurality of color resist units 71 and a black matrix 72. The plurality of color resist units 71 may be disposed in correspondence with the plurality of sub-pixels 31 of the same color. Using the color resist layer 70 to replace the circular polarizer may be able to prevent the reflection of ambient light. In addition, replacing the circular polarizer with the color resist layer 70 may effectively improve the light-output efficiency of the OLED and improve the display performance of the display panel. Further, the thickness of the color resist layer 70 is much smaller than the thickness of the circular polarizer, which may be conducive to reducing the thickness of the display panel, and abandoning the brittle circular polarizer may also be conducive to improving the flexibility of the display panel.

In one embodiment, the disclosed display panel may also include a touch-control layer 60, and the touch-control layer 60 may include a touch-control dielectric layer 61 and a touch-control function layer 62. The touch-control dielectric layer 61 may be disposed on the side of the light-emitting structure layer 30 away from the substrate, and located on the side of the color resist layer 70 close to the substrate 10. The vertical projection of the black matrix 72 on the touch-control layer 60 may cover the touch-control function layer 62. That is, when viewed from the light-emitting surface of the display panel, the touch-control function layer 62 may be located under the black matrix 72, thereby avoiding ambient light from being reflected at the position of the touch-control function layer 62 in the display panel, and thus affecting the visual effect of the display panel.

In one embodiment, the touch-control dielectric layer 61 may be multiplexed as the third optical layer 422 and the fourth optical layer 412, such that the manufacturing process of the display panel may be simplified, the production efficiency may be improved, and the thickness of the display panel may be reduced.

It should be noted that the present disclosure provides an embodiment to exemplarily illustrate a display panel in which the touch-control dielectric layer 61 is multiplexed as the third optical layer 422 and the fourth optical layer 412, but in other embodiments, other dielectric layers in the display panel may be multiplexed as the third optical layer 422 and the fourth optical layer 412, for which, the present disclosure does not provide detailed illustration.

Further, referring to FIG. 9, the color resist layer 70 may be multiplexed as the first optical layer 411 and the second optical layer 421. For example, by multiplexing the color resist layer 70 as the first optical layer 411 and the second optical layer 421, the manufacturing process of the display panel may be simplified, the production efficiency may be improved, and the thickness of the display panel may be reduced. The touch-control dielectric layer 61 may be multiplexed as the third optical layer 422 and the fourth optical layer 412, such that by adjusting the thicknesses of the color resist layer 70 and the touch-control dielectric layer 61, the first adjustment unit 41 and the second adjustment unit 42 may be adjusted. As such, the phase of the external light beams reflected by the sub-pixels may be adjusted. The design of the first adjustment unit 41 and the second adjustment unit 42 may be simple, and the adjustment of the phase of the external light beams reflected by the sub-pixels 31 may be more precisely controlled.

In one embodiment, an interface with a sudden change in the refractive index may be formed between the first optical layer 411 and the fourth optical layer 412 of the first adjustment unit 41 and the second optical layer 421 and the third optical layer 422 of the second adjustment unit 42, and when light beams pass through the interface with the refractive index abruptly changed, a substantial amount of the light beams may undergo reflection, thereby affecting the display performance of the display panel. The touch-control dielectric layer 61 may be disposed on the side of the light-emitting structure layer 30 away from the substrate 10, and also located on the side of the color resist layer close to the substrate 10. The reflected light beams formed when the light beams pass through the interface with the refractive index abruptly changed may be filtered by the color resist layer 70, such that the influence of the reflected light beams may be effectively reduced, and the display performance of the display panel may be improved.

Figure 10:
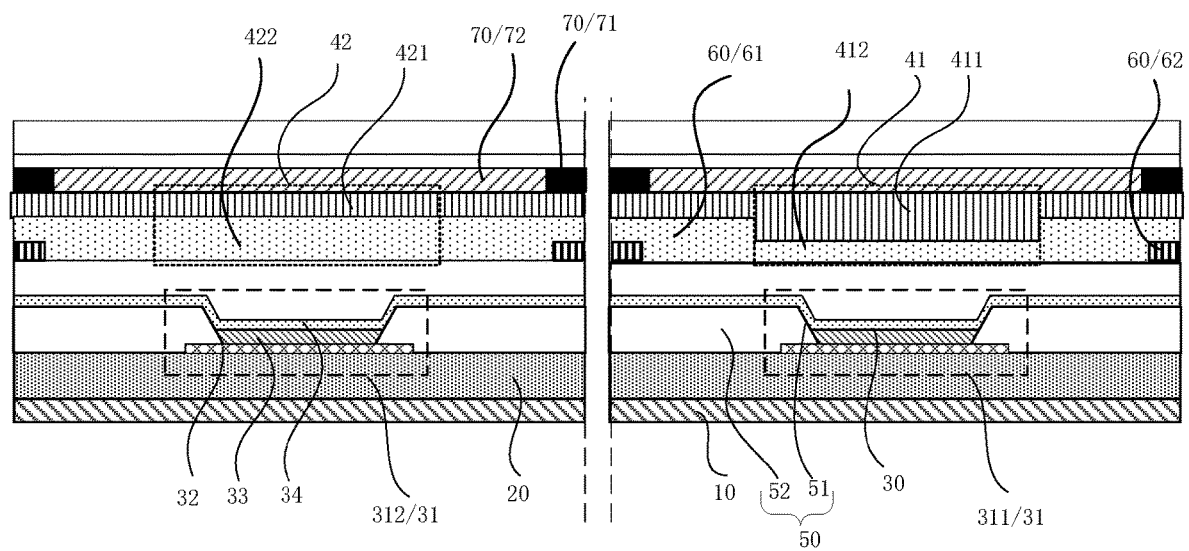
FIG. 10 illustrates a schematic structural diagram of another exemplary display panel according to various embodiments of the present disclosure.

FIG. 10 illustrates a schematic structural diagram of another exemplary display panel according to various embodiments of the present disclosure. Referring to FIG. 10, in one embodiment, the first optical layer 411 may be disposed between the fourth optical layer 412 and the color resist layer 70, and the second optical layer 421 may be disposed between the third optical layer 421 and the color resist layer 70. The transmittance of the first optical layer 411 and the second optical layer 421 may be greater than the transmittance of the color resist layer 70.

For example, referring to FIG. 10, the first optical layer 411 may be located between the fourth optical layer 412 and the color resist layer 70, and the second optical layer 421 may be located between the third optical layer 421 and the color resist layer 70. Along the direction perpendicular to the substrate 10, the thickness of the positions in the color resist layer 70 that correspond to the sub-pixels 31 of the same color may be the same, which may effectively reduce the brightness difference of the display panel and improve the display performance of the display panel. The transmittance of the first optical layer 411 and the second optical layer 421 may be greater than the transmittance of the color resist layer 70, thereby effectively reducing the influence of the first optical layer 411 and the second optical layer 421 on the light-emitting performance of the display panel. In one embodiment, each of the first optical layer 411 and the second optical layer 421 may be a transparent organic film layer.

Figure 11:
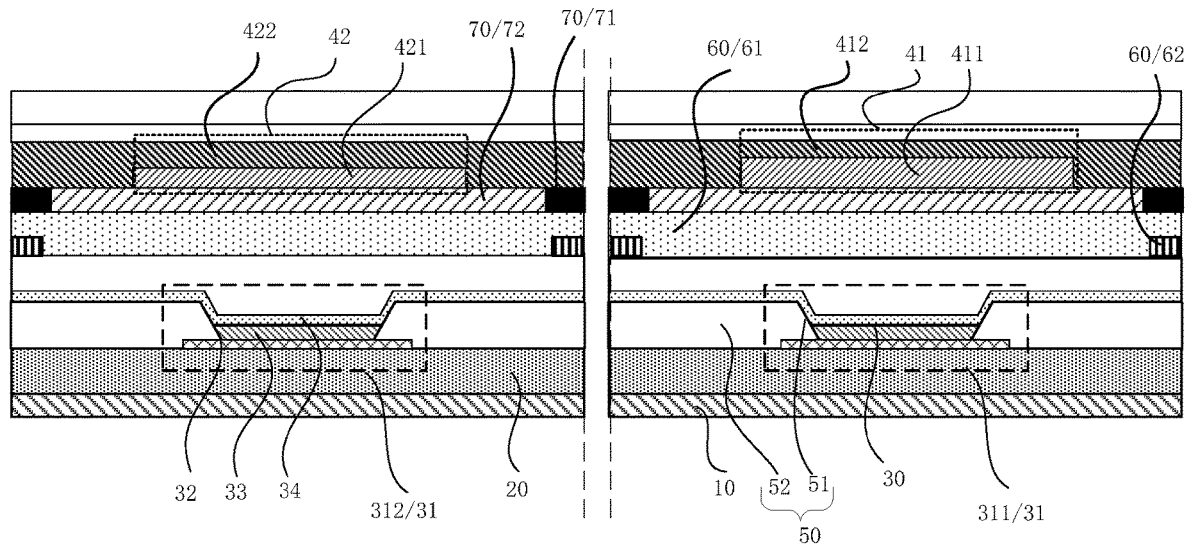
FIG. 11 illustrates a schematic structural diagram of another exemplary display panel according to various embodiments of the present disclosure.

FIG. 11 illustrates a schematic structural diagram of another exemplary display panel according to various embodiments of the present disclosure. Referring to FIG. 11, in one embodiment, the disclosed display panel may further include a color resist layer 70, and the color resist layer 70 may be disposed on the side of the light-emitting structure layer 30 away from the substrate 10. The plurality of first adjustment units 41 and the plurality of second adjustment units 42 may be disposed on the color resist layer 70 away from the substrate 10.

For example, referring to FIG. 11, the plurality of first adjustment units 41 and the plurality of second adjustment units 42 may be disposed on the color resist layer 70 away from the substrate 10. The plurality of first adjustment units 41 and the plurality of second adjustment units 42 may be formed after disposing the color resist layer 70. Alternatively, the plurality of first adjustment units 41 and the plurality of second adjustment units 42 may be formed separately and after disposing the color resist layer 70, the plurality of first adjustment units 41 and the plurality of second adjustment units 42 may then be directly attached to the display panel, thereby reducing the fabrication difficulty of the display panel and improving the production efficiency.

Figure 12:
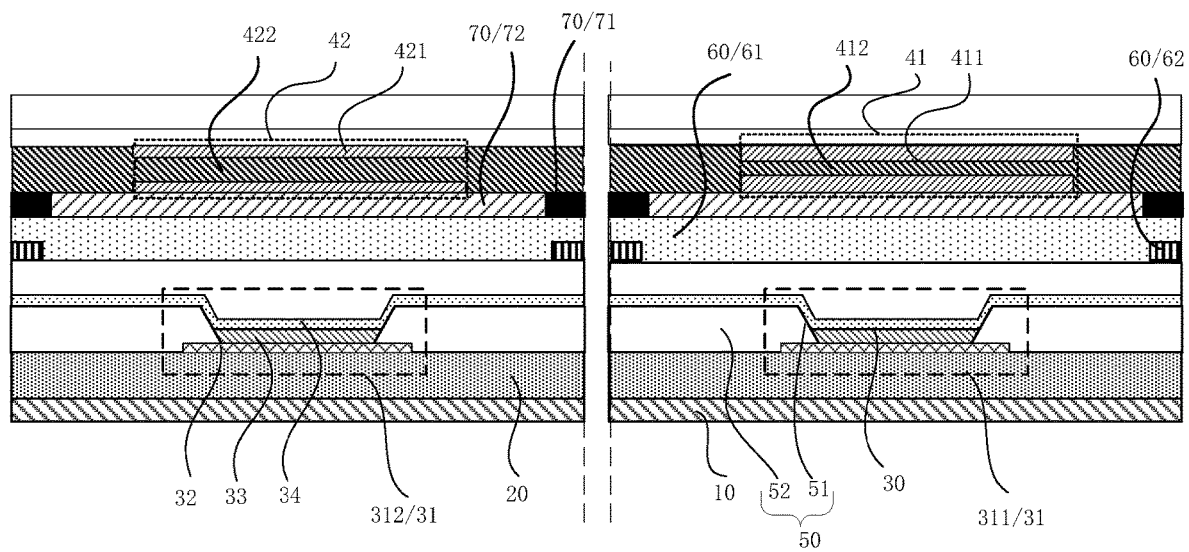
FIG. 12 illustrates a schematic structural diagram of another exemplary display panel according to various embodiments of the present disclosure.

FIG. 12 illustrates a schematic structural diagram of another exemplary display panel according to various embodiments of the present disclosure. Referring to FIG. 12, the equivalent refractive index of the first adjustment unit 41 may be greater than the equivalent refractive index of the second adjustment unit 42.

For example, referring to FIG. 12, the plurality of first adjustment units 41 and the plurality of second adjustment units 42 may each include a plurality of film layers. The equivalent refractive index of the plurality of film layers in the first adjustment units 41 may be greater than the equivalent refractive index of the plurality of film layers in the second adjustment units 42. Because the equivalent refractive index of the first adjustment units 41 is different from the equivalent refractive index of the second adjustment units 42, light beams with a same phase, after passing through a first adjustment unit 41 and a second adjustment unit 42, may have a phase difference greater than zero. The external light beams may reach the anode layers 32 of the plurality of sub-pixels 31 through the first adjustment units 41 or the second adjustment units 42, and may exit from the light-emitting surface of the display panel through the first adjustment units 41 or the second adjustment units 42 after being reflected by the anode layers 32 of the plurality of sub-pixels 31. Because after passing through a first adjustment unit 41 and a second adjustment unit 42, light beams with a same phase may have a phase difference greater than zero, the arrangement of the first adjustment units 41 and the second adjustment units 42 may effectively suppress the grating diffraction phenomenon of the light beams emitted from the light-emitting surface of the display panel after external light beams are reflected by the anode layers 32 of the sub-pixels 31 of the same color.

Figure 13:
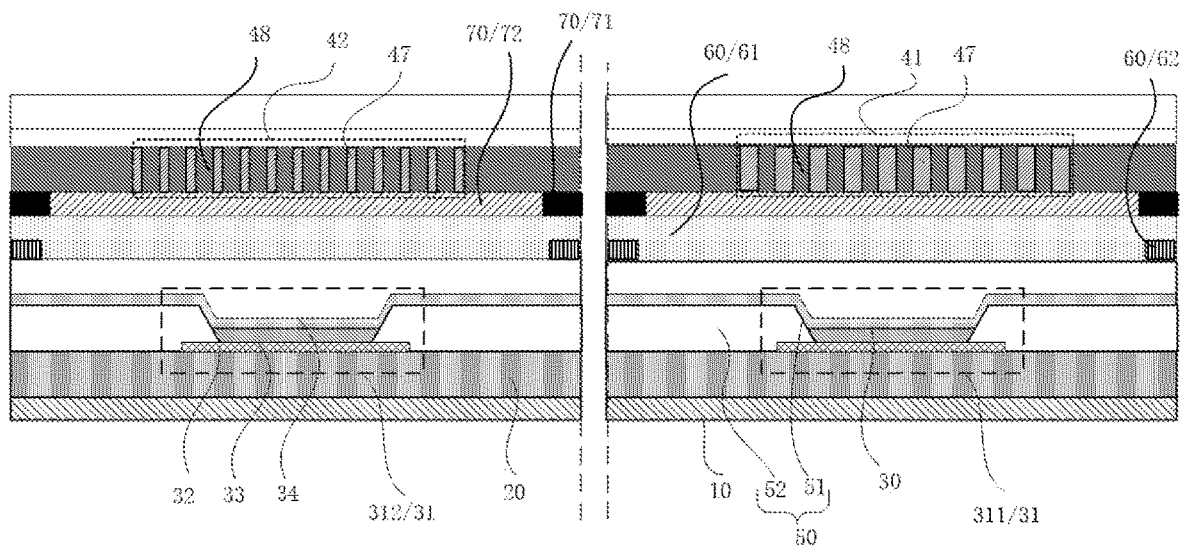
FIG. 13 illustrates a schematic structural diagram of another exemplary display panel according to various embodiments of the present disclosure.

FIG. 13 illustrates a schematic structural diagram of another exemplary display panel according to various embodiments of the present disclosure. Referring to FIG. 13, in one embodiment, the first adjustment unit 41 and the second adjustment unit 42 may both include a plurality of first sub-adjustment-units 47 and a plurality of second sub-adjustment-units 48. The refractive index of the plurality of first sub-adjustment-units 47 may be greater than the refractive index of the second sub-adjustment-units 48. In the first adjustment unit 41 and the second adjustment unit 42, the plurality of first sub-adjustment-units 47 and the plurality of second sub-adjustment-units 48 may be alternately disposed in the direction parallel to the substrate 10, and the volume ratio of the plurality of first sub-adjustment-units 47 in the first adjustment unit 41 may be different from the volume ratio of the plurality of first sub-adjustment-units 47 in the second adjustment unit 42. As such, the equivalent refractive index of the plurality of sub-adjustment-units 47 and the plurality of second sub-adjustment-units 48 in the first adjustment units 41 may be different from the equivalent refractive index of the plurality of first sub-adjustment-units 47 and the plurality of second sub-adjustment-units 48 in the second adjustment units 42.

It should be noted that because FIG. 13 illustrates a two-dimensional view, FIG. 13 only shows that the area of the first sub-adjustment-unit 47 in the first adjustment unit 41 is smaller than the area of the first sub-adjustment-unit 47 in the second adjustment unit 42. In actual applications, the display panel has a three-dimensional structure, and the volume of the first sub-adjustment-units 47 in the first adjustment unit 41 may be smaller than the volume of the first sub-adjustment-units 47 in the second adjustment unit 42.

Further, referring to FIG. 13, the plurality of first sub-adjustment-units 47 may be uniformly distributed in each first adjustment unit 41 and also in each second adjustment unit 42. For example, the plurality of first sub-adjustment-units 47 may be uniformly distributed in the second adjustment unit 42. That is, the second adjustment unit 42 may be provided with a plurality of first sub-adjustment-units 47, and the plurality of first sub-adjustment-units 47 in the second adjustment unit 42 may be arranged at an even interval in the second adjustment unit 42. The plurality of first sub-adjustment-units 47 may be uniformly distributed in the first adjustment unit 41. That is, the first adjustment unit 41 may be provided with a plurality of first sub-adjustment-units 47, and the plurality of first sub-adjustment-units 47 in the first adjustment unit 41 may be arranged at an even interval in the first adjustment unit 41. As such, the uniformity of the light emitted after passing through various components of the first adjustment unit 41 may be improved, and the uniformity of the light emitted after passing through various components of the second adjustment unit 42 may be improved. Therefore, the display performance of the display panel may be improved.

Figure 14:
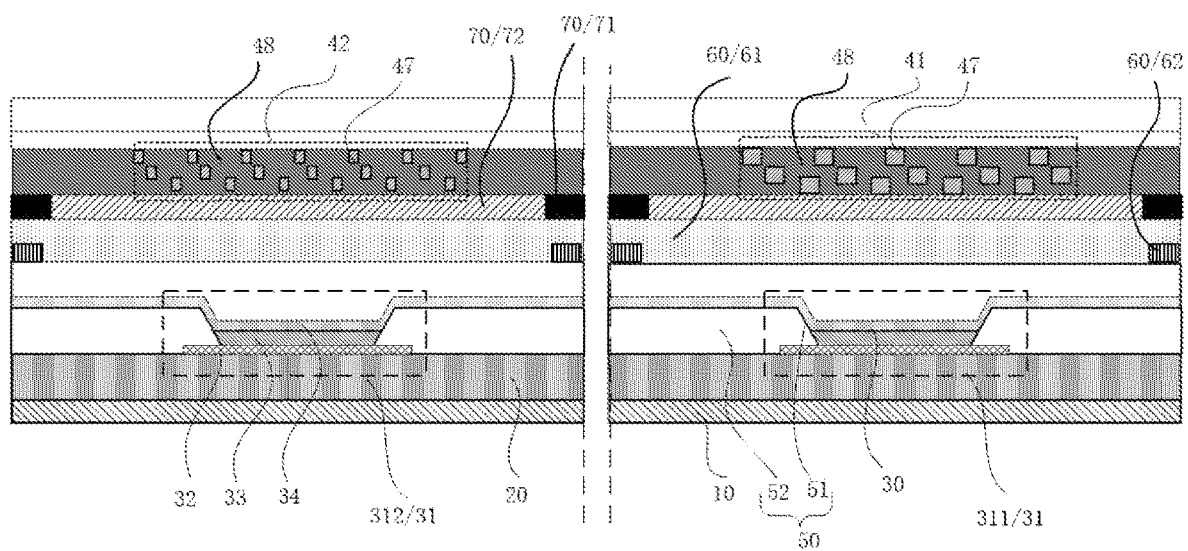
FIG. 14 illustrates a schematic structural diagram of another exemplary display panel according to various embodiments of the present disclosure.

It should be noted that FIG. 13 only shows an exemplary arrangement of the plurality of first sub-units 47 in the second adjustment unit 42 and in the first adjustment unit 41. FIG. 14 illustrates a schematic structural diagram of another exemplary display panel according to various embodiments of the present disclosure. In one embodiment, referring to FIG. 14, each first sub-adjustment-unit 47 may have a strip structure, and the first sub-adjustment-units 47 may be embedded in the second adjustment unit 42 and in the first adjustment unit 41. In addition, the plurality of first sub-adjustment-units 47 may be uniformly distributed in the first adjustment unit 41 and the second adjustment unit 42, thereby further improving the uniformity of the output light beams after the light beams pass through the various components of the first adjustment unit 41, and also further improving the uniformity of the output light beams after the light beams pass through the various components of the second adjustment unit 42. As such, the display performance of the display panel may be further improved. In other embodiments, the plurality of first sub-adjustment-units 47 and the plurality of second sub-adjustment-units 48 may have other appropriate structures, for which, the present disclosure does not provide detailed illustration.

Figure 15:
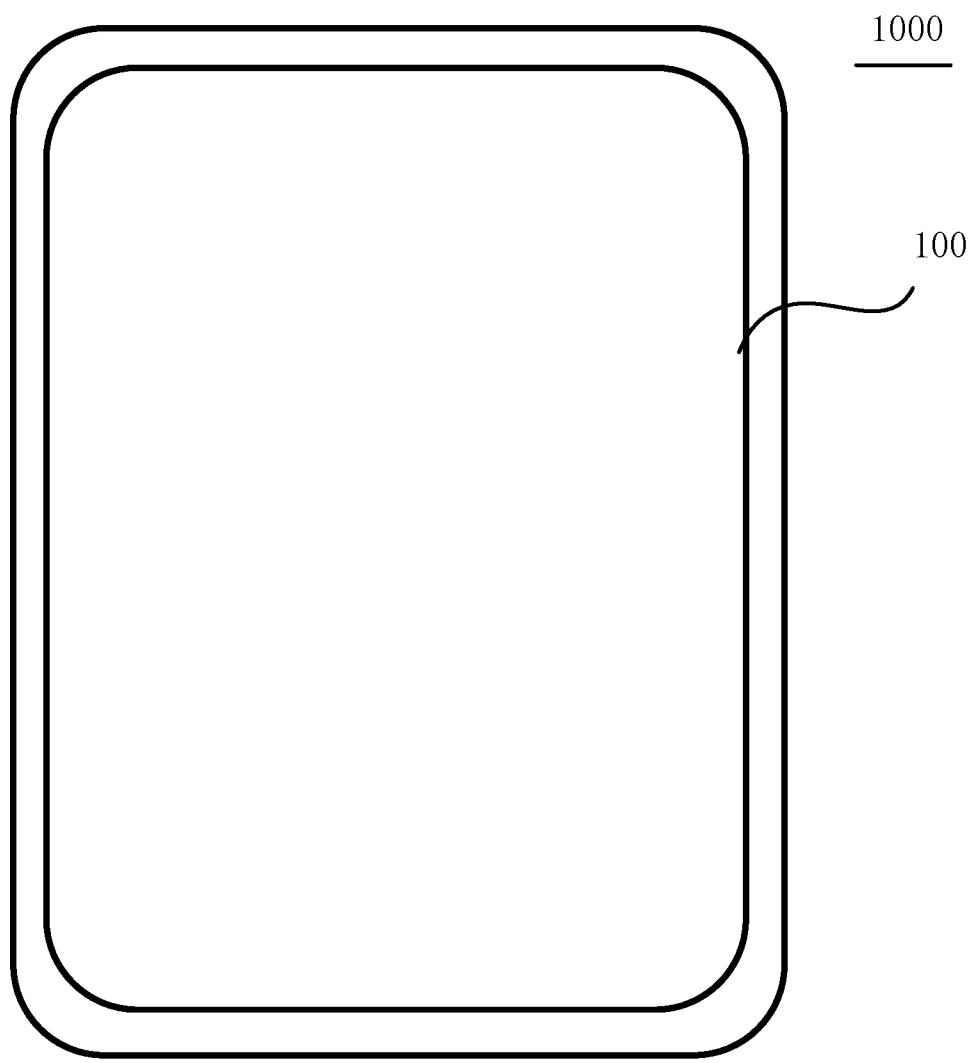
FIG. 15 illustrates a schematic structural diagram of an exemplary display device according to various embodiments of the present disclosure.

The present disclosure also provides a display device, including a display panel according to various embodiments of the present disclosure. FIG. 15 illustrates a schematic structural diagram of an exemplary display device according to various embodiments of the present disclosure. Referring to FIG. 15, the display device 1000 may include a display panel 100, and the display panel 100 may be a display panel consistent with various embodiments of the present disclosure. A mobile phone is shown in FIG. 15 as an example of the disclosed display device 1000. It should be understood that the display device according to various embodiments of the present disclosure may be a computer, a television, a vehicle-mounted display device, or any other type of device with a display function, and the present disclosure does not limit the display device to any specific type.

The display device provided by various embodiments of the present disclosure may have the advantage effects of the display panel provided by the above embodiments of the present disclosure. For details, reference may be made to specific description of the display panel in the embodiments described above, and the present disclosure does not repeat the description herein again.

Compared to existing display panels and display devices, the disclosed display panel and display device may at least demonstrate the following exemplary advantages.

The disclosed display panel includes a substrate, an array layer disposed on a side of the substrate, and a light-emitting structure layer disposed on the side of the array layer away from the substrate. The light-emitting structure layer includes a plurality of sub-pixels, and the plurality of sub-pixels includes a plurality of first sub-pixels and a plurality of second sub-pixels that are in a same color. To simplify the manufacturing process of the display panel and improve the display performance of the display panel, the sub-pixels of the same color in the display panel are periodically arranged. That is, the anode layers of the plurality of sub-pixels in the display panel form a dot-matrix (e.g., lattice) serving as a reflection surface.

In existing display panels, the anode layers of the sub-pixels of the same color thus form a two-dimensional grating surface, such that the grating diffraction phenomenon may take place when external light beams are reflected by the anode layers of the sub-pixels of the same color. When the display panel does not emit light or the luminous brightness is low, the display panel may show obvious color stripes, thereby affecting the display performance of the display panel.

The disclosed display panel further includes a plurality of first adjustment units and a plurality of second adjustment units. The plurality of first adjustment units and the plurality of second adjustment units are disposed on the side of the light-emitting structure layer away from the substrate. The plurality of first adjustment units correspond to the plurality of first sub-pixels in a one-to-one manner, and the vertical projections of each first adjustment unit and the corresponding first sub-pixel on the substrate at least partially overlap. The plurality of second adjustment units correspond to the plurality of second sub-pixels in a one-to-one manner, and the vertical projections of each second adjustment unit and the corresponding second sub-pixel on the substrate at least partially overlap. After passing through a first adjustment unit and a second adjustment unit, light beams with a same phase may have a phase difference greater than zero.

External light beams reach the anode layers of the plurality of sub-pixels through the first adjustment units or the second adjustment units, and exit from the light-emitting surface of the display panel through the first adjustment units or the second adjustment units after being reflected by the anode layers of the plurality of sub-pixels. Because after passing through a first adjustment unit and a second adjustment unit, light beams with a same phase have a phase difference greater than zero, the arrangement of the first adjustment units and the second adjustment units can effectively suppress the grating diffraction phenomenon of the light beams emitted from the light-emitting surface of the display panel after external light beams are reflected by the anode layers of the sub-pixels of the same color.

The various embodiments in the present disclosure are described in a progressive manner, and each embodiment focuses on differences from other embodiments, and the same or similar parts between the various embodiments may be referred to each other.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A display panel, comprising:
    a substrate;
    an array layer, disposed on a side of the substrate;
    a light-emitting structure layer, disposed on a side of the array layer away from the substrate and including a plurality of sub-pixels, wherein the plurality of sub-pixels includes a plurality of first sub-pixels and a plurality of second sub-pixels that are in a same color, wherein the first sub-pixels and the second sub-pixels each has a pixel electrode that is not shared between the first sub-pixel and the second sub-pixel; and
    a plurality of first adjustment units and a plurality of second adjustment units, both disposed on a side of the light-emitting structure layer away from the substrate, wherein:
        the plurality of first adjustment units corresponds to the plurality of first sub-pixels in a one-to-one manner, and vertical projections of each of the plurality of first adjustment units and a corresponding first sub-pixel on the substrate at least partially overlap with each other,
        the plurality of second adjustment units corresponds to the plurality of second sub-pixels in a one-to-one manner, and vertical projections of each of the plurality of second adjustment units and a corresponding second sub-pixel on the substrate at least partially overlap with each other,
        light beams with a same phase, after passing through at least one of the first adjustment units of the plurality of first adjustment units and at least one of the second adjustment units of the plurality of second adjustment units, have a non-zero phase difference, and
        the plurality of first adjustment units and the plurality of second adjustment units are randomly arranged in the display panel.

2. The display panel according to claim 1, wherein:
the vertical projection of each first sub-pixel on the substrate is located in the vertical projection of the corresponding first adjustment unit on the substrate; and
the vertical projection of each second sub-pixel on the substrate is located in the vertical projection of the corresponding second adjustment unit on the substrate.

3. The display panel according to claim 1, wherein:
the plurality of first adjustment units includes a first optical layer; and
the plurality of second adjustment units includes a second optical layer, wherein:
    along a direction perpendicular to the substrate, a thickness of the first optical layer is d1, and a thickness of the second optical layer is d2, wherein d1>d2;
    a refractive index of the first optical layer is n1; and
    a refractive index of the second optical layer is n2.

4. The display panel according to claim 3, wherein:

$$n1 \times d1 - n2 \times d2 \neq 0.$$

5. The display panel according to claim 3, wherein:
the plurality of second adjustment units further includes a third optical layer, wherein:
    along the direction perpendicular to the substrate, a thickness of the third optical layer is d3; and
    a refractive index of the third optical layer is n3.

6. The display panel according to claim 5, wherein:

$$d1 = d2 + d3, \text{ and}$$

$$n1 \times d1 - n2 \times d2 - n3 \times d3 \neq 0.$$

7. The display panel according to claim 5, wherein:
the plurality of first adjustment units further includes a fourth optical layer, wherein:
    along the direction perpendicular to the substrate, a thickness of the fourth optical layer is d4; and a refractive index of the fourth optical layer is n4, wherein:

$$d1+d4=d2+d3,$$

$$d4<d3, \text{ and}$$

$$n1 \times d1 + n4 \times d4 - n2 \times d2 - n3 \times d3 \neq 0.$$

8. The display panel according to claim 7, wherein:
the first optical layer and the second optical layer are located in a same film layer, made of a same material, and n1=n2;
the third optical layer and the fourth optical layer are located in a same film layer, made of a same material, and n3=n4; and
a phase difference between light beams reflected by the plurality of first sub-pixels and light beams reflected by the plurality of second sub-pixels is $4\pi/\lambda \times (d3-d4) \times (n1-n3)$, where $\lambda$ is a wave-length of the light beams after being reflected by the plurality of first sub-pixels and the plurality of second sub-pixels.

9. The display panel according to claim 8, further including a touch-control layer and a color resist layer, wherein:
the touch-control layer includes a touch-control dielectric layer and a touch-control function layer, the touch-control dielectric layer disposed on the side of the light-emitting structure layer away from the substrate;
the color resist layer is disposed on a side of the touch-control dielectric layer away from the light-emitting structure layer;
the color resist layer includes a plurality of color resist units and a black matrix, wherein the plurality of color resist units is arranged corresponding to the plurality of sub-pixels of the same color, and a vertical projection of the black matrix on the touch-control layer covers the touch-control function layer; and
the touch-control dielectric layer is multiplexed as the third optical layer and the fourth optical layer.

10. The display panel according to claim 9, wherein:
the color resist layer is multiplexed as the first optical layer and the second optical layer.

11. The display panel according to claim 9, wherein:
the first optical layer is located between the fourth optical layer and the color resist layer;
the second optical layer is located between the third optical layer and the color resist layer; and
a transmittance of the first optical layer and the second optical layer is greater than a transmittance of the color resist layer.

12. The display panel according to claim 8, further including a color resist layer, wherein:
the color resist layer is disposed on the side of the light-emitting structure layer away from the substrate; and
the plurality of first adjustment units and the plurality of second adjustment units are located on a side of the color resist layer away from the substrate.

13. The display panel according to claim 1, further including a plurality of adjustment-unit groups, wherein:
the plurality of adjustment-unit groups includes M rows of sub-units arranged in a first direction and N columns of sub-units arranged in a second direction, wherein the first direction and the second direction are intersected with each other, and
each adjustment-unit group includes first adjustment units and second adjustment units, wherein the first adjustment units and the second adjustment units are randomly arranged in the adjustment-unit group, wherein: M and N are integers, M>2, and N>2.

14. The display panel according to claim 1, further including a plurality of third adjustment units and a plurality of fourth adjustment units, wherein:
the plurality of sub-pixels further includes a plurality of third sub-pixels and a plurality of fourth sub-pixels, wherein:
the plurality of first sub-pixels, the plurality of second sub-pixels, the plurality of third sub-pixels, and the plurality of fourth sub-pixels are in a same color;
the plurality of third adjustment units corresponds to the plurality of third sub-pixels in a one-to-one manner, and vertical projections of each third adjustment unit and a corresponding third sub-pixel on the substrate at least partially overlap with each other;
the plurality of fourth adjustment units corresponds to the plurality of fourth sub-pixels in a one-to-one manner, and vertical projections of each fourth adjustment unit and a corresponding fourth sub-pixel on the substrate at least partially overlap with each other;
light beams with a same phase, after passing through any two adjustment units of a first adjustment unit, a second adjustment unit, a third adjustment unit, and a fourth adjustment unit, have a non-zero phase difference; and
the light beams with the same phase, after passing through different pairs of adjustment units of a first adjustment unit, a second adjustment unit, a third adjustment unit, and a fourth adjustment unit, have different phase differences.

15. The display panel according to claim 14, wherein:
the plurality of first adjustment units, the plurality of second adjustment units, the plurality of third adjustment units, and the plurality of fourth adjustment units, are randomly arranged in the display panel.

16. The display panel according to claim 1, wherein:
an equivalent refractive index of the plurality of first adjustment units is greater than an equivalent refractive index of the plurality of second adjustment units.

17. The display panel according to claim 16, wherein:
the plurality of first adjustment units and the plurality of second adjustment units both include a plurality of first sub-adjustment-units and a plurality of second sub-adjustment-units, wherein:
a refractive index of the plurality of first sub-adjustment-units is greater than a refractive index of the plurality of second sub-adjustment-units;
the plurality of first sub-adjustment-units and the plurality of second sub-adjustment-units are alternately arranged in a direction parallel to the substrate;
a volume ratio of the plurality of first sub-adjustment-units in each first adjustment unit is V1; and
a volume ratio of the plurality of first sub-adjustment-units in each second adjustment unit is V2, wherein:

$$V1>V2.$$

18. The display panel according to claim 17, wherein:
the plurality of first sub-adjustment-units is uniformly distributed in each second adjustment unit and in each first adjustment unit.

19. A display device, including a display panel, including:
a substrate;
an array layer, disposed on a side of the substrate;

a light-emitting structure layer, disposed on a side of the array layer away from the substrate and including a plurality of sub-pixels, wherein the plurality of sub-pixels includes a plurality of first sub-pixels and a plurality of second sub-pixels that are in a same color, wherein the first sub-pixels and the second sub-pixels each has a pixel electrode that is not shared between the first sub-pixel and the second sub-pixel; and a plurality of first adjustment units and a plurality of second adjustment units, both disposed on a side of the light-emitting structure layer away from the substrate, wherein:

the plurality of first adjustment units corresponds to the plurality of first sub-pixels in a one-to-one manner, and vertical projections of each of the plurality of first adjustment units and a corresponding first sub-pixel on the substrate at least partially overlap with each other, the plurality of second adjustment units corresponds to the plurality of second sub-pixels in a one-to-one manner, and vertical projections of each of the plurality of second adjustment units and a corresponding second sub-pixel on the substrate at least partially overlap with each other, light beams with a same phase, after passing through at least one of the first adjustment units of the plurality of first adjustment units and at least one of the second adjustment units of the plurality of second adjustment unit, have a non-zero phase difference, and the plurality of first adjustment units and the plurality of second adjustment units are randomly arranged in the display panel.

\* \* \* \* \*